US010811081B2

(12) United States Patent
Takayama et al.

(10) Patent No.: US 10,811,081 B2
(45) Date of Patent: Oct. 20, 2020

(54) APPARATUSES FOR DECREASING WRITE PULL-UP TIME AND METHODS OF USE

(71) Applicant: Micron Technology, Inc., Boise, ID (US)

(72) Inventors: Shinichi Takayama, Yokohama (JP); Ken Saito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 16/218,237

(22) Filed: Dec. 12, 2018

(65) Prior Publication Data

US 2020/0194051 A1 Jun. 18, 2020

(51) Int. Cl.
| | | |
|---|---|---|
| *G11C 11/408* | (2006.01) | |
| *G11C 11/56* | (2006.01) | |
| *G11C 11/4074* | (2006.01) | |
| *G11C 7/12* | (2006.01) | |
| *G11C 8/08* | (2006.01) | |
| *G11C 8/10* | (2006.01) | |
| *G11C 7/10* | (2006.01) | |

(52) U.S. Cl.
CPC ........ *G11C 11/4085* (2013.01); *G11C 7/1039* (2013.01); *G11C 7/12* (2013.01); *G11C 8/08* (2013.01); *G11C 8/10* (2013.01); *G11C 11/4074* (2013.01); *G11C 11/4087* (2013.01); *G11C 11/5628* (2013.01); *G11C 2207/005* (2013.01)

(58) Field of Classification Search
CPC ............ G11C 11/4085; G11C 11/4074; G11C 11/4087; G11C 11/5628; G11C 7/1039; G11C 7/12; G11C 8/08; G11C 8/10

USPC ............ 365/230.06, 230.08, 185.21, 185.22, 365/185.23, 185.25

See application file for complete search history.

(56) References Cited

U.S. PATENT DOCUMENTS

| | | | | |
|---|---|---|---|---|
| 8,896,354 | B1 * | 11/2014 | Hong ................... | H03K 19/00 327/108 |
| 2008/0304344 | A1 * | 12/2008 | Do ....................... | G11C 8/08 365/201 |
| 2010/0061159 | A1 * | 3/2010 | Kim ..................... | G11C 5/143 365/189.07 |
| 2010/0110801 | A1 * | 5/2010 | Song ................... | G11C 5/143 365/189.05 |

* cited by examiner

*Primary Examiner* — Connie C Yoha
(74) *Attorney, Agent, or Firm* — Dorsey & Whitney LLP

(57) ABSTRACT

Embodiments of the disclosure are drawn to apparatuses and methods for charging memory data lines when a high charge level is to be written to a memory. The apparatus may include a write amplifier that includes one or more additional pull-up drivers for charging the memory data lines. Control logic may control when additional pull-up drivers are activated. Control logic may control when main data lines are coupled to shared data lines. Methods for charging memory data lines may include providing control signals that indicate which main data lines are coupled to shared data lines and when a write command is received. Methods may include providing a signal that is indicative of the data to be written. The control signals and signal indicative of the data to be written may be used to activate one or more pull-up drivers to charge one or more data lines.

20 Claims, 7 Drawing Sheets

US 10,811,081 B2

APPARATUSES FOR DECREASING WRITE PULL-UP TIME AND METHODS OF USE

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a charge on a capacitive element. This may be referred to as writing to the memory cell. The magnitude of the charge (e.g., charge value) may be indicative of the information stored. For example, a low charge value may correspond to a "0" stored in the memory cell and a high charge value may correspond to a "1" in the memory cell in some devices.

Charging the capacitive element to a high charge value may require additional time and/or power compared to charging the capacitive element to a low charge value. This may increase the time to perform some write operations. Thus, decreasing the time to charge the capacitive element to the high charge value is desired.

DETAILED DESCRIPTION

Figure 1:
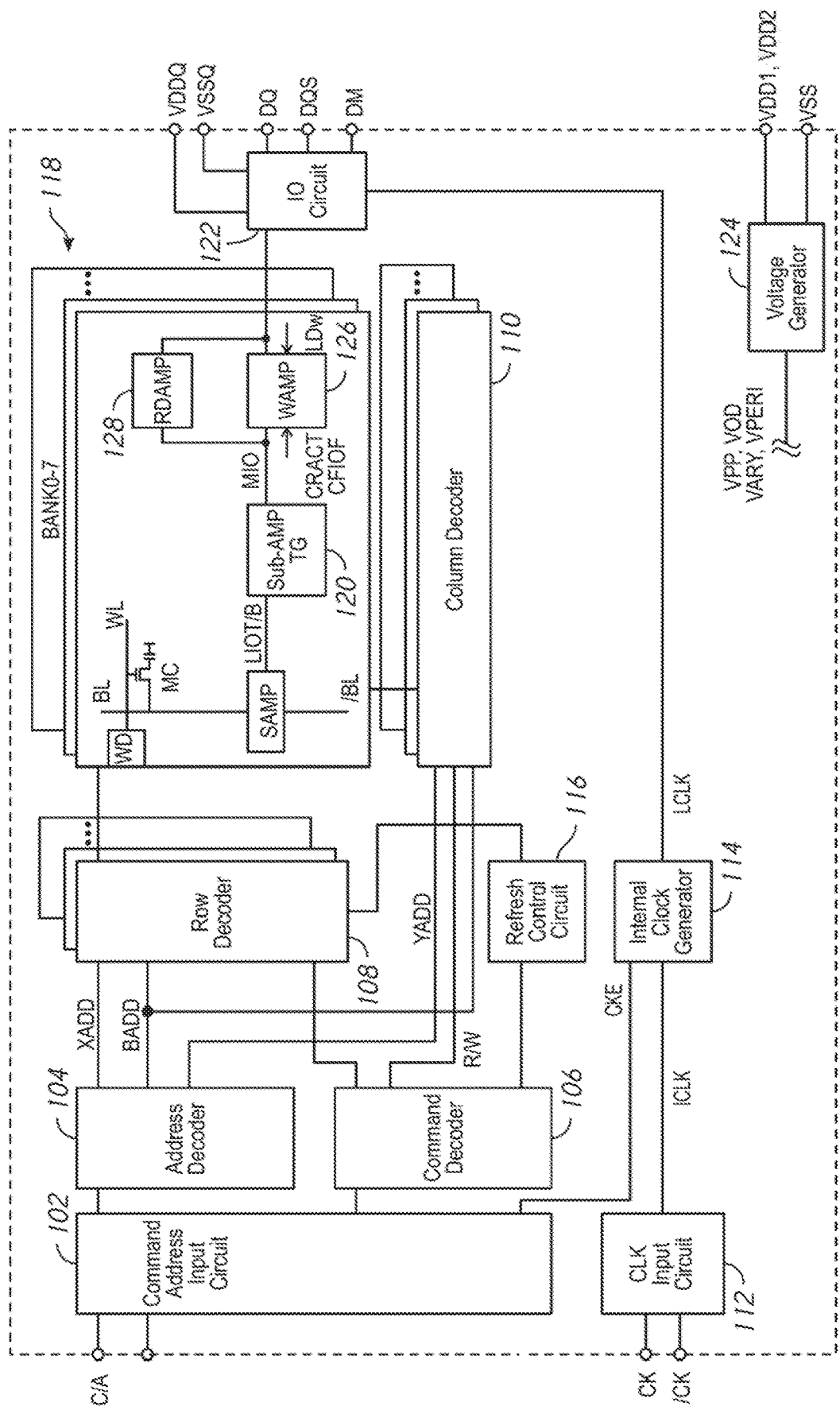
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information may be stored on individual memory cells of the memory as a charge on a capacitive element. The magnitude of the charge (e.g, charge value) may be indicative of the information stored. In some embodiments, the magnitude of the charge, and thus the information on the memory cell, may be determined by measuring a voltage across the memory cell and/or detecting a current from the memory cell. A high voltage or current may be associated with a higher magnitude charge whereas a low voltage or current may be associated with a lower magnitude charge. High voltages (e.g., 3V, 5V) may be associated with high logic states and/or "1" whereas lower voltages (e.g., 0V) may be associated with low logic states and/or "0." To write a "1" to a memory cell, a memory line (e.g., data line) may be charged to a high voltage in order to charge the memory cell to the appropriate level. To write a "0" to the memory cell, the Memory line May be charged to a lower voltage. Although the examples described herein associate low voltages with low logic states and "0" and high voltages with high logic states and "1," it is understood that these associations may be different without departing from the principles of the disclosure.

In some memory applications, it may be desirable to share one or more elements between memory arrays and/or portions of a memory array in a memory device. For example, it may be desirable to share an error correction circuit, bank logic, an amplifier, and/or an input/output line. Sharing one or more elements may reduce chip size and/or reduce the number of elements needed for the memory device. However, in some cases, sharing one or more elements may increase impedance experienced by the one or more shared elements. The increased impedance may increase rise times of one or more memory hues during some memory operations. That is, it may increase the time it takes for a line to be charged to a higher voltage (e.g, 3V, 5V) compared to a lower voltage (e.g., 01V). For example, during a write operation where a high charge value (e.g., to write a "1") is to be written to a memory cell, a memory line (e.g., data line) coupled to the memory cell must be charged to the higher voltage. When the memory line is long (e.g., shared between memory arrays or portions of a memory array), it may take longer to charge the memory line to the higher voltage. This may make writing information (e.g., data) that corresponds to high charge values (e.g., "1") take longer than writing information that corresponds to low charge values (e.g., "0").

A write amplifier may include a pull-up/down driver to charge memory lines to appropriate voltages to write information to a memory. To reduce the charge time of memory lines, and thus the time to write information corresponding to high charge values to memory cells, one or more pull-up drivers may be added to a Write amplifier included in the memory device. The one or more pull-up drivers may assist the pull-up/down driver, to charge one or more memory lines to the appropriate voltages to write information to the memory. To reduce power consumption, the one or more pall-up drivers may be activated only when high charge values are to be written to the memory cells.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is Shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 128, which provides the data to an IO circuit 122. Write data received from 10 circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL. The write amplifier 126 may include one or more pull-up drivers for charging (e.g., driving) a memory line during certain memory operations. The write amplifier 126 may receive control signals CRACT and CROF. The control signals may control various operations of the write amplifier 126. CRACT may control from which unshared memory lines data is received. CFIOF may control whether or not an additional pull-up driver is activated to assist with charging a main data line MID. The write amplifier 126 may also receive a signal LDw that is indicative of data to be written to the memory cell MC.

The semiconductor device 100 may employ a plurality of external terminals that include command and address (C/A) terminals coupled to a command and address bus to receive commands and addresses, and a CS signal, clock terminals to receive clocks CK and /CK, data terminals DC) to provide data, and power supply terminals to receive power supply potentials VDD1, VDD2, VSS, VDDQ, and VSSQ.

The dock terminals are supplied with external docks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded hank address BADD, which may indicate the hank of the memory array 118 containing the decoded row address XADD and column address YADO. The CIA terminals may be supplied with commands. Examples of commands include timing commands for controlling the timing of various operations, access commands for accessing the memory, such as read commands for perfuming read operations and write commands for performing write operations, as well as other commands and operations. The access commands by be associated with one or more row address XADD, column address YADD and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When a read command is received, and a bank address, a row address and a column address are timely supplied with the read command, read data is read from memory cells MC in the memory array 118 corresponding to the row address and column address. The read command is received by the command decoder 106 (e.g., command controller), which provides internal commands so that read data from the memory array 118 is provided to the read amplifier 128. The read data is output to outside from the data terminals DQ via the input/output circuit 122.

The device 100 may receive an access command which is a write command. When the write command is received, and a bank address, a row address and a column address are timely supplied with the write command, Nyrne data supplied to the data terminals DQ written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing, it to carry out an auto-refresh operation. The refresh signal may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. The refresh signal is supplied to the refresh control circuit 116. The refresh control circuit 116 supplies a refresh row address to the row decoder 108, which may refresh a word line WL indicated by the refresh row address. The refresh control circuit 116 may control a timing of the refresh operation, and may generate and provide the refresh address.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDC) and VSSO supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
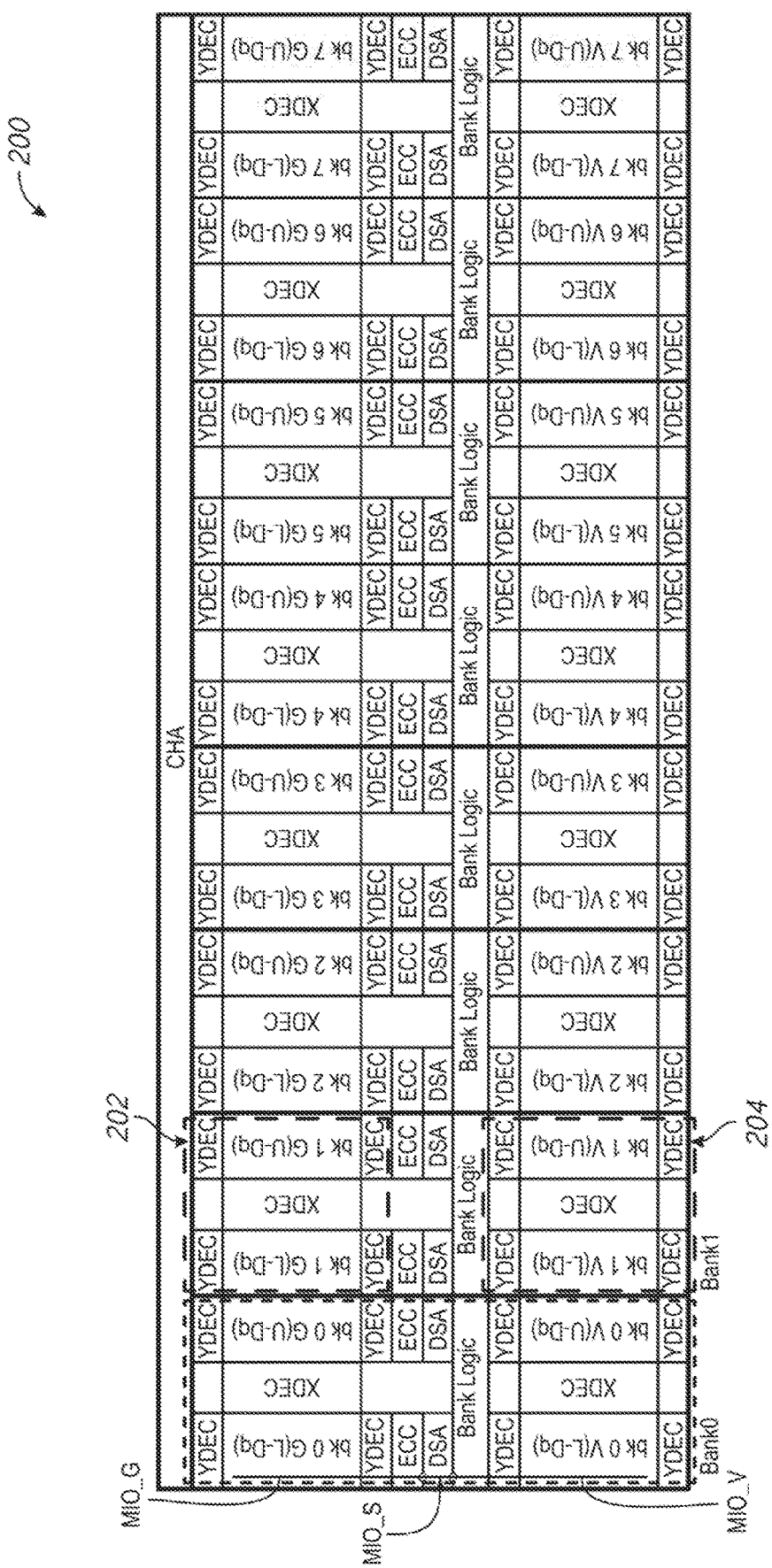
FIG. 2 is a layout diagram of a semiconductor device according to an embodiment of the disclosure.

FIG. 2 is a layout diagram of a portion of a semiconductor device 200 according to an embodiment of the disclosure. The semiconductor device 200 may be a semiconductor memory device, such as a DRAM device integrated on a single semiconductor chip. In some embodiments, semiconductor device 100 may include the layout shown for semiconductor device 200.

Semiconductor device 200 may include multiple memos y banks in the example shown in FIG. 2, semiconductor device 200 includes eight memory banks, Bank0 is outlined to illustrate the extent of a single memory bank. Each bank may have a first portion 202 and a second portion 204. For illustration, the upper and lower levels of Bank1 are outlined in dashed lines. The first portion 202 may be accessed by main data line MIO_G and the second portion 204 may be accessed by main data line MIO_V. The first and second portions 202 and 204 may share one or more memory elements. For example, the first and second portions 202, 204 may share a main amplifier (DSA), bank logic, and/and error correction circuitry (ECC). A shared data line MIO_S may be selectively coupled to main data lines MIO_G and MIO_V. In the example shown in FIG. 2, a shared main amplifier DSA is coupled to a shared data line MIO_S.

In some embodiments, the main amplifier DSA may include read and/or write amplifiers for one or more sections of memory and/or portions of memory arrays e.g., write amplifier 126 and read amplifier 128 shown in FIG. 1). That is, the read and/or write amplifiers may be shared, in the example shown in FIG. 2, the first and second portions 202, 204 of Bank0 may share read and/or write amplifiers included in shared main amplifier DSA. Including a shared data line MIO_S and main amplifier DSA may increase impedance levels on the main data lines MIO_G, MIO_V, and/or shared data line MIO_S. This may make it more difficult to charge the data lines when writing data to a memory bank when the data is associated with a high charge. Accordingly, a write amplifier of the DSA may include one or more additional pull-up drivers.

Figure 3:
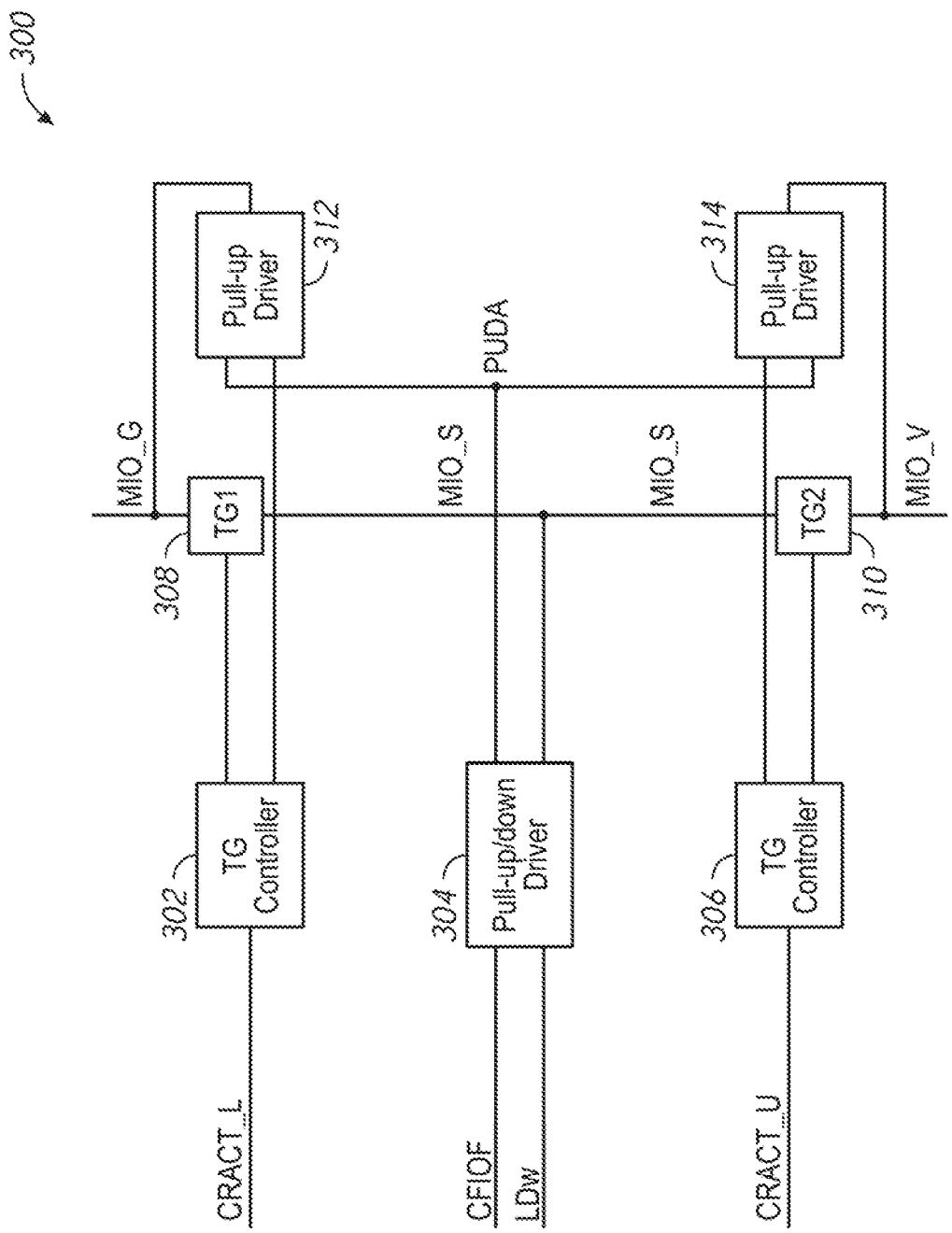
FIG. 3 is a block diagram of a write amplifier according to an embodiment of the disclosure.

FIG. 3 is a block diagram of a write amplifier 300 according to an embodiment of the disclosure. In some embodiments, the write amplifier 300 may be used to implement write amplifier 126 shown in FIG. 1. In some embodiments, the write amplifier 300 may be included in a main amplifier, such as main amplifier DSA in FIG. 2. The write amplifier 300 may include transfer gate control circuit (e.g., controller) 302, which may control transfer gate 308. When transfer gate 308 is activated, it may form a conductive path between main data line MIO_G and shared data line MIO_S. When transfer gate 308 is not activated, the conductive path between main data line MOI_G and shared data line MIO_S may be terminated. The write amplifier 300 may include transfer gate control circuit (e.g., controller) 306, which may control transfer gate 310. When transfer gate 310 is activated, it may form a conductive path between main data line MIO_V and shared data line MIO_S. When transfer gate 310 is not activated, the conductive path between main data line MIO_V and shared data line MIO_S may be terminated.

Write amplifier 300 may include pull-up/down driver 304. The pull-up/down driver 304 may charge shared data line MIO_S for a write operation. The pull-up down/driver 304 may further charge main data line MIO_G or main data line MIO_V if a conductive path exists to either one via transfer gate 308 or transfer gate 310, respectively. Write amplifier 300 may include pull-up driver 312, which may assist pull-up/down driver 304 to charge shared data line MIO_S and main data line. MIO_G during certain write operations. Write amplifier 300 may include pull-up driver 314, which may assist pull-up down driver 304 to charge shared data line MIO_S and/or main data line MIO_V during certain write operations. Pull-up driver 312 and pull-up driver 314 may decrease the time required for shared data line MIO_S and/or main data line MIO_G or MIO_V to charge to a voltage level necessary to write a high charge level to a memory cell.

As discussed with reference to FIG. 1, the write amplifier may receive one or more control signals. In the embodiment shown in FIG. 3, the write amplifier receives CRACT_L, CRACT_U, CFIOF, and LDw. CRACT_L may be provided to transfer gate controller 302. CRACT_L may be an active low signal. That is when CRACT_L is low, the transfer gate control circuit 302 may activate transfer gate 308. Activation of transfer gate 308 may provide a conductive path between main data line MIO_G and shared data line MIO_S. When CRACT_L is low, transfer gate control circuit 302 may provide an enable signal to pull-up driver 312. Similarly, CRACT_U may be art active low signal. When CRACT_U is low, the transfer gate control circuit 30$ may activate transfer gate 310. Activation of transfer gate 310 may provide a conductive path between main data line MIO_V and shared data line MIO_S. When CRACT_U is low, transfer gate control circuit 306 may provide an enable signal to pull-up driver 314. In some embodiments, only one of CRACT_L and CRACT_U may be low at a given time.

Pull-up/down driver 304 miry receive a command control signal CFIOF. CFIOF may indicate a type of memory access command received by the memory, such as a read or a write command. For example, CFIOF may be high when a write command has been received. Pull-up/down driver 304 may also receive signal Signal LDw may be a signal that has a state (e.g., high or low) indicative of data to be written. When CFIOF is high (e.g., responsive to a write command), pull-up/down driver 304 may be activated and charge MIO_S based on the state of the LDw signal.

Pull-up/down driver 304 may send a pull-up driver activation (PUDA) signal to pull-up drivers 312 and 314, PUDA may be an active low signal. When CFIOF is high, indicating a write command has been received, and signal LDw has a state that indicates data associated with a high level of charge is to be written to a memory cell, PUDA may be low.

If pull-up driver 312 has been enabled by an enable signal from transfer gate control circuit 302, pull-up driver 312 will be activated by the low PUDA signal and charge main data line MIO_G and/or shared data line MIO_S. If pull-up driver 314 has been enabled by an enable signal from transfer gate control circuit 306, pull-up driver 314 will be activated by the low PUDA signal and charge main data line. MIO_V and/or shared data line MIO_S. Activating the pull-up driver 312 or pull-up driver 314 may assist the pull-up/down driver 304 in charging the main data line MIO_G or MIO_V, respectively.

Figure 4:
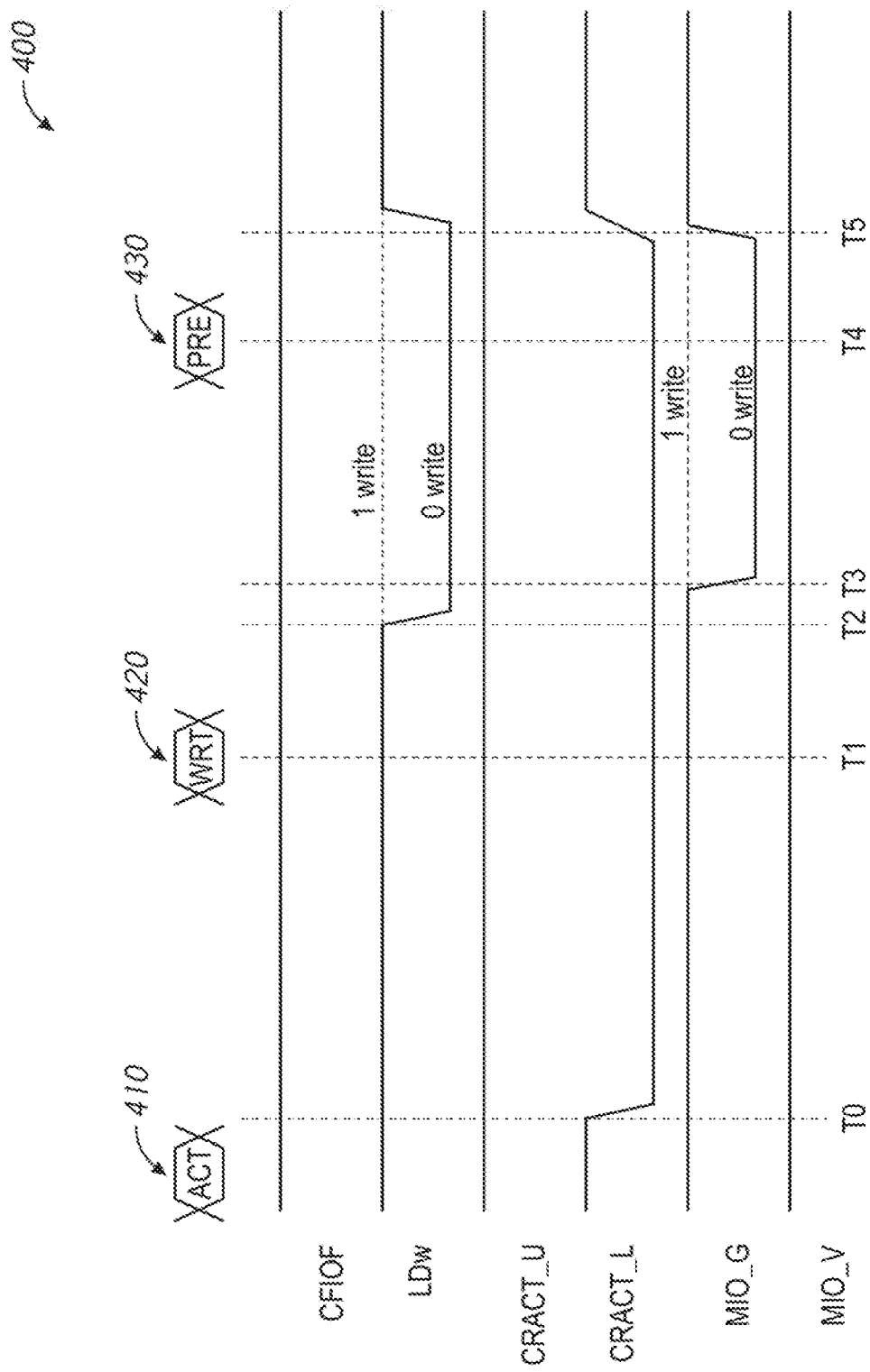
FIG. 4 is a timing diagram of a write operation according to an embodiment of the disclosure.

FIG. 4 is a timing diagram 400 of a write operation according to art embodiment of the disclosure. The timing diagram 400 illustrates the states of control signals and data line signals of write amplifier 300 shown in FIG. 3 in response to memory commands. The memory commands may be received by a command address input circuit, such as command address input circuit 102 shown in FIG. 1. The commands may be provided by the command address input circuit to a command controller, such as command decoder 106. In some embodiments, the command controller may control the states of the control signals and data lines based, at least in part, on the received commands. States of control signals CFIOF, CRACT_U, and CRACT_L are shown. The states of an LDw signal, main data line MIO_G, and main data line MIO_V are also shown.

In the timing diagram 400, an activation signal related to an activation command 410 has already been received. An address that indicates a row and/or column to be accessed in a memory array may have also been provided not shown in FIG. 4). The address may have been provided from the command address input circuit to an address decoder, such as address decoder 104 shown in FIG. 1. The appropriate row address and column address may have been provided to a row decoder and column decoder, respectively, such as row decoder 108 and column decoder 110 shown in FIG. 1. As shown in FIG. 4, main data lines MIO_V and MIO_G have been charged to a precharge state in response to receipt of a precharge signal. For example, in the example of FIG. 4, the precharge state for the main data lines MIO_V and MIO_G is shown as a high state.

At a time $T_0$, the control signal CRACT_L goes low. The selection of CRACT_L versus CRACT_U may be based on the address received with the activation signal. The low CRACT_L signal causes transfer gate controller 302 to activate transfer gate 308, forming a conductive path between main data line MIO_G and shared data line MIO_S. The low CRACT_L signal further causes the transfer gate control circuit 302 to send an active enable signal (e.g., active high state) to pull-up driver 312.

As shown in timing diagram 400, control signal CRACT_U stays high. Thus, the transfer gate controller 306 keeps transfer gate 310 deactivated, so no conductive path is formed between main data line MIO_V and shared data line MIO_S. Thus, MIO_V remains high. Furthermore, the high CRACT_U signal causes the transfer gate control circuit 306 to send an inactive enable signal (e.g., inactive low state) to the pull-up driver 314.

At time $T_1$, a write command 420 is received. In response, control signal CFIOF remains high to indicate a write command. After receipt of the write command 420, LDw may take a state indicative of the data to be written at the received address at time $T_2$. In the example shown in FIG. 4, a high state may be associated with writing a "1" (e.g., high charge value) and a low state may be associated with writing a "0" (e.g., low charge value) to the address.

If the state of LDw indicates a "1" is to be written to the address, as shown by the dashed lines in FIG. 4, the pull-up/down driver 304 sends an active activation signal, PUDA (e.g., active low state), to the pull-up drivers 312 and 314. Pull-up driver 312, which earlier received an active enable signal from the transfer gate controller 302 responsive to the low CTACT_L signal, is activated by the active activation signal PUDA and drives main data line MIO_G at time $T_3$ to a high state. In contrast, pull-up driver 314 received an inactive enable signal from transfer gate controller 306 and thus, pull-up driver 314 is not activated upon receipt of the active PUDA signal.

If the state of LDw indicates a "0" is to be written to the address, as shown by the solid lines in FIG. 4, the pull-up/down driver 304 does not send an activation signal, and the PUDA signal remains high. As a result, neither pull-up driver 312 nor 314 are activated. At time $T_3$, in response to the state of LDw, the pull-up/down driver 304 pulls MIO_G to a low level for writing a "0" to the address.

At time $T_4$, a precharge command 430 is received. The precharge command 430 may cause the control signals and data lines of the write amplifier to return to pre-activation states to prepare for receipt of a subsequent memory access operation. Following time $T_5$, the control signals CFIOF, CRACT_U, and CRACT_L are at a high state, LDw is at a high state, and the data lines MIO_V and MIO_G are at a high state in preparation for a subsequent memory access operation.

Figure 5:
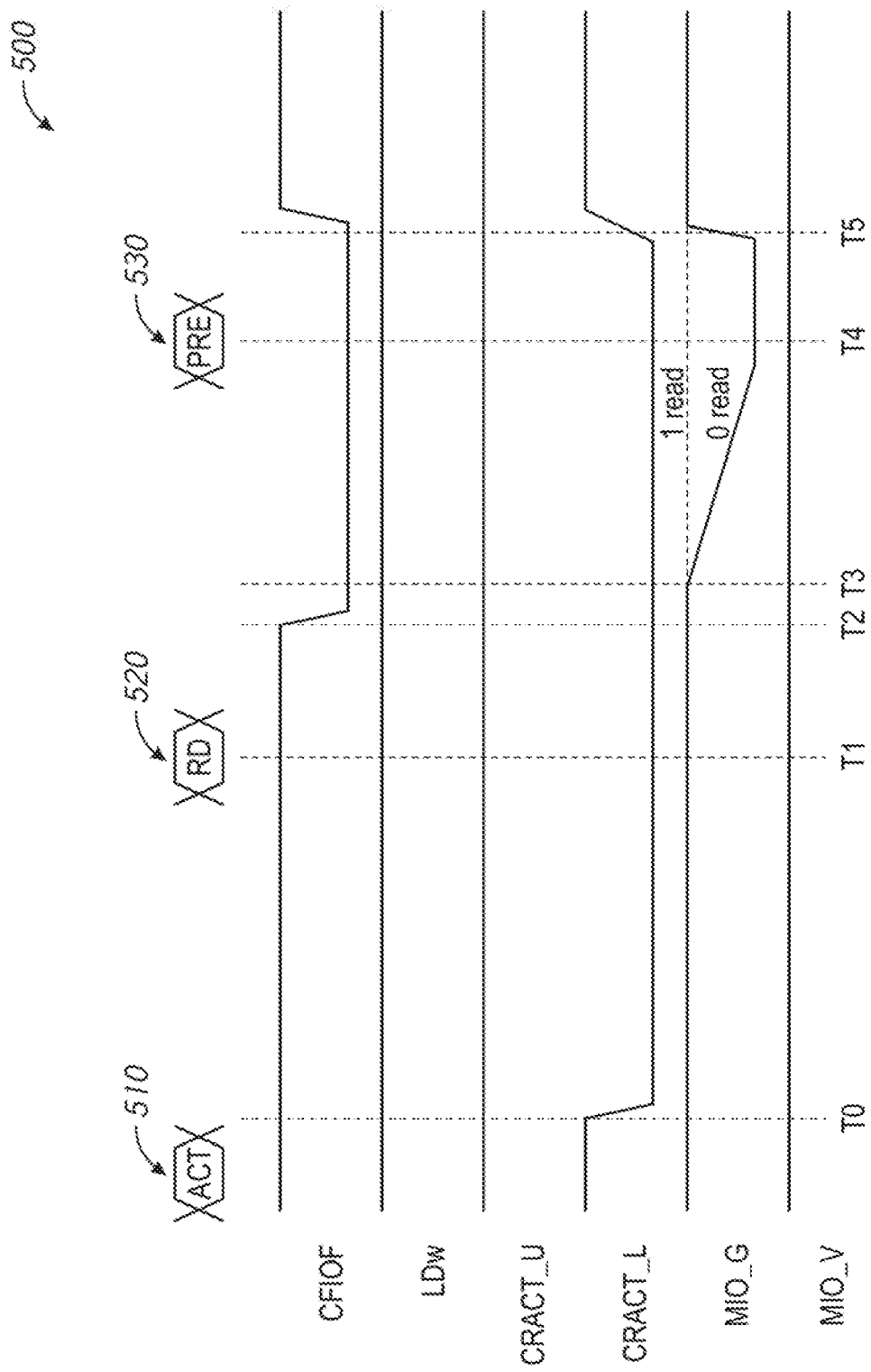
FIG. 5 is a timing diagram of a read operation according to an embodiment of the disclosure.

FIG. 5 is a timing diagram 500 of a read operation according to an embodiment of the disclosure. The timing diagram 500 illustrates the states of control signals and data line signals of write amplifier 300 shown in FIG. 3. In the timing diagram 500, an activation signal related to an activation command 510 has already been received. An address that indicates a row and or column to be accessed in a memory array may have also been provided (not shown in FIG. 5). As shown in FIG. 5, main data lines MIO_V and MIO_G have been charged to a precharge state in response to receipt of a precharge signal. As with the example of FIG. 4, in the example of FIG. 5 the precharge state for the main data lines MIO_V and MIO_G is shown as a high state.

At a time $T_0$, the control signal CRACT_L goes low. The selection of CRACT_L versus CRACT_U may be based on the address received with the activation signal. The low CRACT_L signal causes transfer gate controller 302 to activate transfer gate 308, forming a conductive path between main data line MIO_G and shared data line MIO_S. The conductive path may allow read data from the memory array to be provided by the main data line MIO_G to the shared data line MIO_S in some embodiments. In some embodiments, read data from the memory array may be provided to a read amplifier, such as read amplifier 128 shown in FIG. 1. The low CRACT_L signal further causes the transfer gate controller 302 to send an active enable signal (e.g., active high state) to pull-up driver 312.

As shown in timing diagram 500, control signal CRACT_U stays high. Thus, the transfer gate controller 306 keeps transfer gate 310 deactivated, so no conductive path is formed between main data line. MIO_V and shared data line MIO_S. Thus, MIQ_V remains high. Furthermore, the high CRACT_U signal causes the transfer gate controller 306 to send an inactive enable signal (e.g., inactive low state) to the pull-up driver 314.

At time $T_1$, a read command 520 is received. In response, at time $T_2$, control signal CFIOF switches to a low state to indicate a read command. LDw may not take a state indicative of data to be written to memory because no data is to be written during a read command. As shown in the example in FIG. 5, LDw may remain in a high state during a read command, in response to the low CFIOF signal, the pull-up/down driver 304 provides an inactive activation signal PUDA (e.g., PUDA remains high) to the drivers 312 and 314. Thus, although pull-up driver 312 is enabled by the transfer gate controller 302, the pull-up driver 312 does not become active and charge the data line MIO_G.

At time $T_3$, data read from the memory array is provided to main data line MIO_G. If a "1" is read, main data line MIQ_G remains at a high state as indicated by the dashed line in FIG. 5. If a "0" is read, main data line MIO_G drops to a low state as indicated by the solid line in FIG. 5.

At time $T_4$, a precharge command 530 is received. The precharge command 530 may cause the control signals and data lines of the write amplifier to return to pre-activation states to prepare for receipt of a subsequent memory access operation. Following time $T_5$, the control signals CFIOF, CRACT_U, and CRACT_L are at a high state, LDw is at a high state, and the data lines MIO_V and MIO_G are are at a high state in preparation for a subsequent memory access operation.

Figure 6:
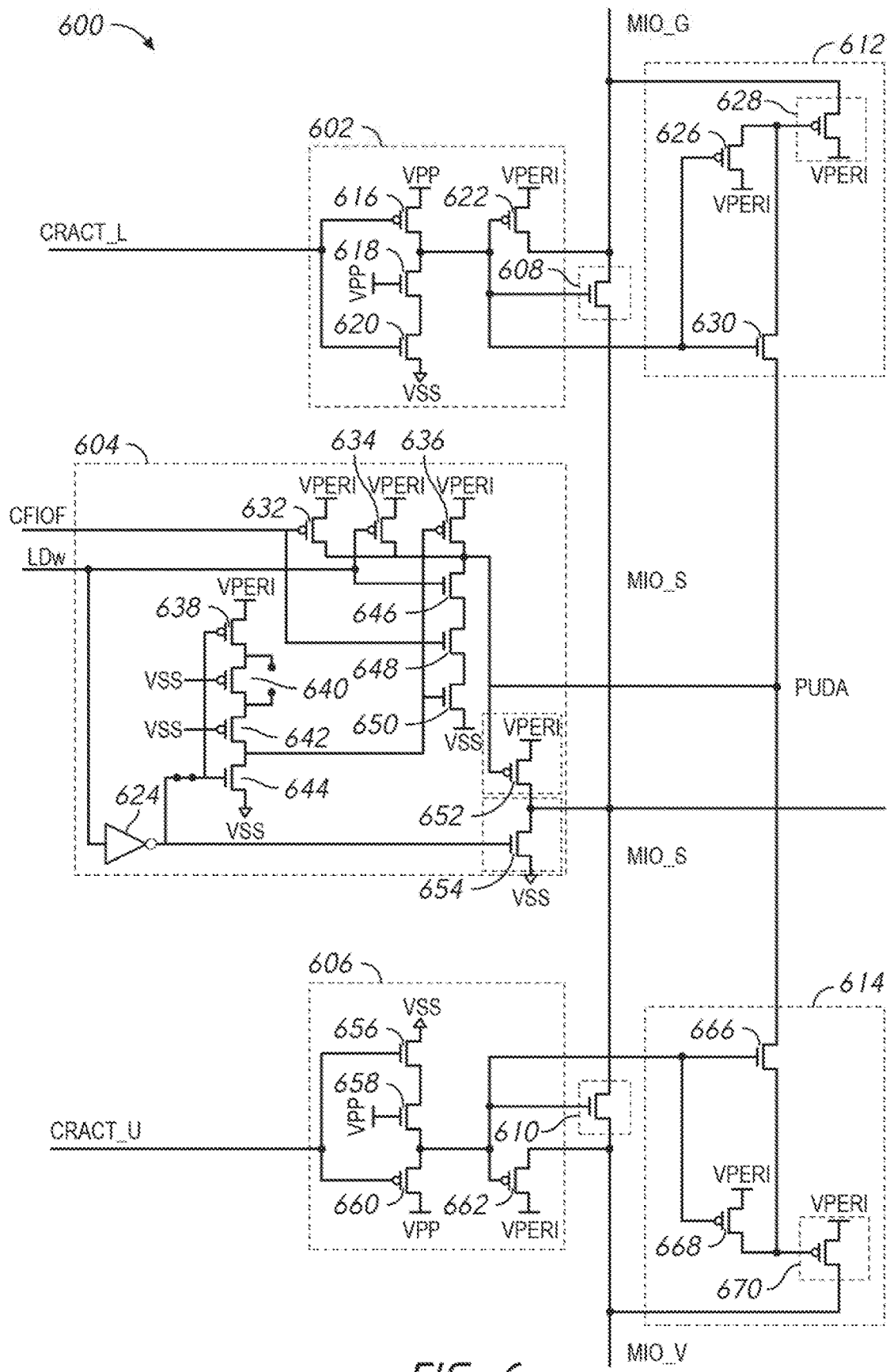
FIG. 6 is a circuit diagram of a semiconductor device according to an embodiment of the disclosure.

FIG. 6 is a circuit diagram of a write amplifier 600 according to embodiments of the disclosure. The write amplifier 600 may be used to implement write amplifier 300 in some embodiments. The write amplifier 600 may operate in a manner similar to the operation previously described with reference to timing diagrams 400 and 500 shown in FIGS. 4 and 5, respectively, in some embodiments. The write amplifier 600 may include transfer gate controller 602, pull-up/down driver 604, transfer gate controller 606, transfer gate 608, transfer gate 610, pull-up driver 612, and pull-up driver 614.

Transfer gate controller 602 may include control logic. In the example shown in FIG. 6, the control logic includes transistors 616, 618, 620, and 622. Transistor 616 may be a p-channel transistor having its gate coupled to a conductive path that provides control signal CRACT_L, its source coupled to a voltage source (e.g., providing a voltage VPP), and its drain coupled to the drain of transistor 618. Transistor 618 may be an n-channel transistor having its gate coupled to a voltage source (e.g., providing the voltage VPP) and its source coupled to the drain of transistor 620. Transistor 620 may be an n-channel transistor having its gate coupled to the conductive path that provides control signal CRACT_L and its source coupled to a voltage source (e.g., providing a voltage VSS). Transistor 622 may be a p-channel transistor having its gate coupled to the drains of transistors 616 and 618. The source of transistor 622 may be coupled to a voltage source (e.g., providing a voltage VPERI) and the drain may be coupled to the drain of transfer gate 608. Transfer gate 608 may include an n-channel transistor with its gate coupled to the drains of transistors 616 and 618 and its source coupled to shared data line MIO_S. The drain of transfer gate 608 may be further coupled to main data line MIO_G.

Transfer gate controller 606 may have a similar structure to transfer gate controller 602 in some embodiments. As illustrated in FIG. 6, transfer gate controller 606 may include control logic. In the example shown in FIG. 6, the control logic includes transistors 656, 658, 660, and 662. Transistor 656 may be an n-channel transistor having its gate coupled to a conductive path that provides control signal CRACT_U, its drain coupled to a voltage source (e.g., providing the voltage VSS), and its source coupled to the drain of transistor 658. Transistor 658 may be an n-channel transistor having its gate coupled to a voltage source, and its source coupled to the source of transistor 660. Transistor 660 may be a p-channel transistor having its gate coupled to the conductive path that provides control signal CRACT_U and its drain coupled to a voltage source (e.g., providing the voltage VPP). Transistor 662 may be a p-channel transistor having its gate coupled to the sources of transistors 658 and 660. The drain of transistor 622 may be coupled to a voltage source (e.g., providing the voltage VPERI) and the source may be coupled to the source of transfer gate 610.

Transfer gate 610 may include an n-channel transistor with its gate coupled to the sources of transistors 658 and 660 and its drain coupled to shared data line MIO_S. The source of transfer gate 610 may be further coupled to main data line MIO_V.

Pull-up/down driver 604 may include control logic. In the example shown in FIG. 6, the control logic includes transistors 632, 634, 636, 638, 640, 642, 644, 646, 648, and 650. The control logic may further include inverter 624. The pull-up driver 604 may further include pull-up transistor 552 and pull-down transistor 654.

Transistor 632 may be a p-channel transistor having its gate coupled to a conductive path that provides control signal CFIOF. The source of transistor 632 may be coupled to a voltage source (e.g., providing the voltage VPERI) and its drain may be coupled to the drains of transistors 634 and 636 and the gate of pull-up transistor 652. Transistor 634 may be a p-channel transistor having its gate coupled to a conductive path that provides signal LDw and its source coupled to a voltage source (e.g., providing the voltage VPERI). Transistor 636 may be a p-channel transistor having its gate coupled to the drains of transistors 642 and 644, its source coupled to a voltage source (e.g., providing the voltage VPERI), and its drain coupled to the drain of transistor 646.

Inverter 624 may have an input coupled, to a conductive path that provides signal LDw. The output of inverter 624 may be provided to the gates of transistors 638, 644, and a gate of pull-down transistor 654. Transistor 638 may be a p-channel transistor having its source coupled to a voltage source (e.g., providing the voltage VPERI), its drain coupled to the source of transistor 640. Transistor 640 may be a p-channel transistor having its gate coupled to a voltage source (e.g., providing the voltage VSS) and its drain coupled to the source of transistor 642. Transistor 642 may be a p-channel transistor having its gate couple to a voltage source (e.g., providing the voltage VSS) and its drain coupled to the drain of transistor 644. Transistor 644 may be an a-channel transistor having its source coupled to a voltage source (e.g., providing the voltage VSS).

Transistor 646 may be an n-channel transistor having its gate coupled to the conductive path providing signal LDw, its drain coupled to the drain of transistor 636, and its source coupled to the drain of transistor 648. Transistor 648 may be an n-channel transistor having its gate coupled to the conductive line providing control signal CFIOF. The source of transistor 648 may be coupled to the drain of transistor 650. Transistor 650 may be an n-channel transistor having its gate coupled to the drains of transistors 642 and 644. The source of transistor 650 may be coupled to a voltage source (e.g., providing the voltage VSS).

Pull-up transistor 652 may be a p-channel transistor having a gate coupled to the drains of transistors 632, 634, and 636. The source of transistor 652 may be coupled to a voltage source (e.g., providing the voltage VPERI) and its drain may be coupled to the shared data line MIO_S. Pull-down transistor 654 may be an n-channel transistor having its gate coupled to the output of inverter 624, its source coupled to a voltage source (e.g., providing the voltage VSS), and its drain coupled to shared data line MIO_S.

A pull-up driver activation (PUDA) signal may be provided by the pull-up/down driver 604. A conductive path for providing the PUDA signal may be coupled to the drains of transistors 648 and 650.

Pull-up driver 612 may include transistors 626 and 630. Pull-up driver 612 may further include pull-up transistor 628. Transistor 626 may be a p-channel transistor with its gate coupled to the drains of transistors 616 and 618 of the transfer gate controller 602. The source of transistor 626 may be coupled to the gate of pull-up transistor 628 and the drain of transistor 630. The drain of transistor 626 may be coupled to a voltage source (e.g., providing the voltage VPERI). Transistor 630 may be an n-channel transistor having its gate coupled to the drains of transistors 616 and 618 of the transfer gate controller 602. The source of transistor 630 may be coupled to the conductive line that provides the PUDA signal. The drain of transistor 630 may be coupled to the gate of pull-up transistor 628. The pull-up transistor 628 may be a p-channel transistor having its drain coupled to a voltage source (e.g., providing the voltage VPERI) and its source coupled to a main data line MIO_G.

Pull-up driver 614 may have a similar structure to pull-up driver 612 in some embodiments. Pull-up driver 614 may include transistors 666 and 668. Pull-up driver 614 may further include pull-up transistor 670. Transistor 668 may be a p-Channel transistor with its gate coupled to the sources of transistors 658 and 660 of the transfer gate controller 606. The drain of transistor 668 may be coupled to the gate of pull-up transistor 670 and the source of transistor 666. The source of transistor 668 may be coupled to a voltage source (e.g., providing the voltage VPERI). Transistor 666 may be an n-channel transistor having its gate coupled to the sources of transistors 558 and 660 of the transfer gate controller 606. The drain of transistor 666 may be coupled to the conductive line that provides the PUDA signal. The source of transistor 666 may be coupled to the gate of pull-up transistor 670. The pull-up transistor 670 may be a p-channel transistor having its source coupled to a voltage source (e.g., providing the voltage VPERI) and its drain coupled to a main data line MIO_V.

The write amplifier 600 described herein may function in the same manner as write amplifier 300 as described with reference to FIGS. 3-5. Furthermore, the write amplifier 600 of FIG. 6 is an example implementation of a write amplifier according to embodiments of the disclosure. Write amplifier 600 may be implemented with alternative circuits and/or components. For example, one or more of the transistors of write amplifier 600 may implemented with bipolar junction transistors in some embodiments.

In operation, an active CRACT_L signal (e.g., active low state) causes transistor 616 to be conductive and provide the voltage VPP to activate the transfer gate 608, thus forming a conductive path between main data line MIO_G and the shared data line MIO_S. The activated transistor 616 also provides an active enable signal to activate transistor 630 to provide a conductive path for the PUDA signal to be provided to the pull-up transistor 628. The pull-up transistor 628 may be activated by an active PUDA signal (e.g., active low state) to charge the main data line MIO_G to a high level. For example, an activated pull-up transistor 628 is conductive and provides the VPERI voltage to charge the main data line MIO_G. An inactive CRACT_L signal (e.g., inactive high state) causes transistor 620 to be conductive and provide the voltage VSS to deactivate the transfer gate 608 to be non-conductive and to activate the transistor 622 to provide the VPERI voltage to the main data line MIO_G. The activated transistor 620 also provides an inactive enable signal to deactivate the transistor 630 and to activate the transistor 626, which provides the VPERI voltage to deactivate the pull-up transistor 628.

With reference to the transfer gate controller 606 and the pull-up driver 614, an active CRACT_U signal (e.g., active low state) causes transistor 660 to be conductive and provide the voltage VPP to activate the transfer gate 610, thus forming a conductive path between main data line MIO_V and the shared data line MIO_S. The activated transistor 660 also provides an active enable signal to activate transistor 666 to provide a conductive path for the PUDA signal to be provided to the pull-up transistor 670. As previously described, the pull-up transistor 670 may be activated by an active PUDA signal (e.g., active low state) to charge the main data line MIO_V to a high level. For example, an activated pull-up transistor 670 is conductive and provides the VPERI voltage to charge the main data line MIO_V. An inactive CRACT_U signal (e.g., inactive high state) causes transistor 656 to be conductive and provide the voltage VSS to deactivate the transfer gate 610 to be non-conductive and to activate the transistor $62 to provide the VPERI voltage to the main data line MIO_V. The activated transistor 6656 also provides an inactive enable signal to deactivate the transistor 666 and to activate the transistor 668, which provides the VPERI voltage to deactivate the pull-up transistor 670.

With reference to the pull-up/down driver 604, when the CFIOF signal indicates a write command (e.g., high state), the transistor 648 is activated to provide a conductive path between the transistors 646 and 650. A high state LDw signal (e.g., indicates a high level to be written) activates the transistor 646 and further activates the transistor 638. The activated transistor 638 provides through transistors 640 and 642 the VPERI voltage to activate the transistor 650. The activated transistor 650 provides the VSS voltage to activate the pull-up transistor 652, which provides the VPERI voltage to charge the shared data line MIO_S. The activated transistor 650 also provides the VSS voltage as an active PUDA signal, which may be used to activate the pull-up transistor 628 or pull-up transistor 670. A low state LDw signal (e.g., indicates a low level to be written) activates the transistor 634 and also activates the transistor 644 to provide the VSS voltage to activate the transistor 636. The activated transistors 634 and 636 provide the VPERI voltage to deactivate the pull-up transistor 652. The VPERI voltage is also provided as an inactive PUDA signal. The low state LDw signal further activates the pull-down transistor 654, which charges the shared data line MIO_S to the low voltage VSS.

Thus, when the CFIOF signal indicates a write command, a low state LDw causes the shared data line MIO_S to be charged to a low level, and a high state LDw causes the shared data line MIO_S to be charged to a high level and also causes the PUDA signal to be active, which are similar to the operations previously described with reference to FIG. 4.

When the CFIOF signal indicates a read command (e.g., low state), the transistor 632 is activated to provide the VPERI voltage to deactivate the pull-up transistor 652. The activated transistor 632 also provides the VPERI voltage is an inactive PUDA signal. As previously described, the pull-up/down driver is not operated as part of the access operation when a CFIOF signal indicates a read command.

Figure 7:
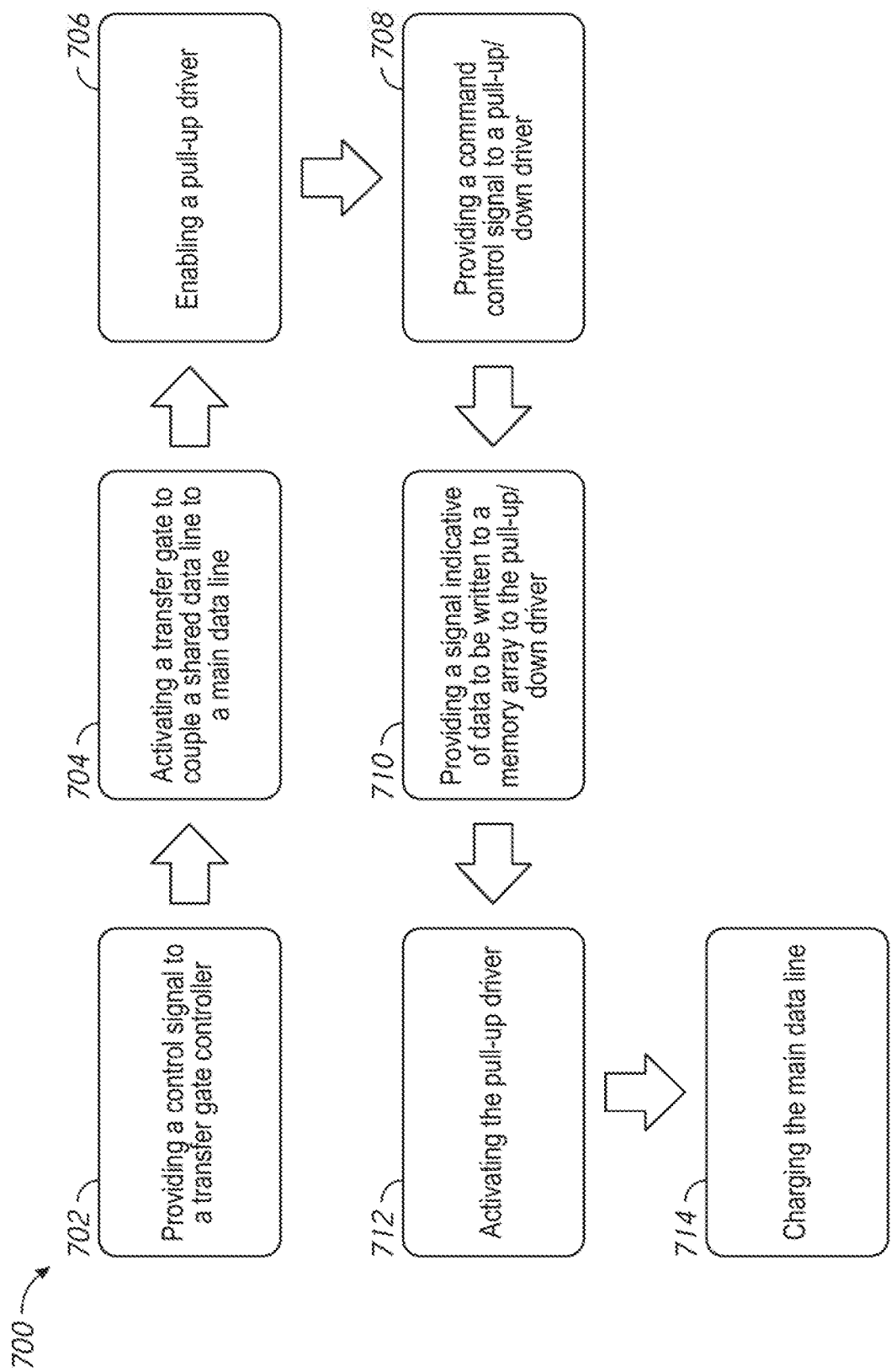
FIG. 7 is a flow chart of a method according to an embodiment of the disclosure.

FIG. 7 is a flow chart of a method 700 according to an embodiment of the disclosure. The method 700 may be used to charge a data line in a memory for writing data to a memory associated with a high charge value. In some embodiments, the method 700 may be performed by the write amplifier 300 of FIG. 3 and/or write amplifier 600 shown in FIG. 6.

At block 702, "providing a control signal to a transfer gate controller" may be performed. The control signal may be provided by a command controller of a memory in some embodiments. The control signal may be based, at least in part, on an address received by a memory. At block 704, "activating a transfer gate to couple a shared data line to a main data line." In some embodiments, the activating may be performed by the transfer gate controller. The activating may be in response to the receipt of the control signal. At block 706 "enabling, a pull-up driver" is performed. In some embodiments, the enabling may be performed by the transfer gate controller. The enabling may be in response to the receipt of the control signal. At block 708, "providing a command control signal to a pull-up/down driver" is performed. The command control signal may be provided by the command controller in some embodiments. The command control signal may be based on a memory access command received by the command controller. At block 710, "providing a signal indicative of data to be written to a memory array to the pull-up/down driver," may be performed. The signal may be provided by the command controller in some embodiments. The signal may be based, at least in part, on data received at an IO circuit that is to be written to the memory. At block 712, "activating the pull-up driver," may be performed. In some embodiments, the activating may be performed by the pull-up/down driver. The activating may occur when the command control signal has a state indicative of a write command and the signal has a state indicative of a high charge value to be written to a memory. At block 714, "charging the main data line" may be performed. In some embodiments, the charging may be performed by the pull-up driver.

Although blocks 702-714 are shown as being performed sequentially, in some embodiments, some blocks may be performed in a different order or at the same time. For example, blocks 704 and 706 may be performed simultaneously. In another example, block 706 may be performed before block 704. Other arrangements may be possible.

The apparatuses and methods described herein may increase the rise time for a data line when the data line is to be charged to a high voltage level for writing data to a memory cell associated with a high charge level.

Of course, it is to be appreciated that an one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a first transfer gate controller;
   a first transfer gate coupled to the first transfer gate controller, wherein the first transfer gate is configured to provide a conductive path between a first main data line and a shared data line when activated by the first transfer gate controller;
   a first pull-up driver coupled to the first transfer gate controller, wherein the first transfer gate controller is configured to enable the first pull-up driver; and
   a pull-up/down driver, comprising:
      a pull-up transistor coupled to the shared data line;
      a pull-down transistor coupled to the shared data line; and
      control logic coupled to the first pull-up driver, wherein the control logic is configured to activate the first pull-up driver and wherein the first pull-up driver is configured to charge the first main data line when activated by the pull-up/down driver and enabled by the first transfer gate controller.

2. The apparatus of claim 1, wherein the first transfer gate controller is configured to receive a first control signal, wherein the first transfer gate controller is configured to activate the first transfer gate and enable the first pull-up driver based on the first control signal.

3. The apparatus of claim 1, wherein the pull-up/down driver is configured to receive a command control signal indicating a memory access command and a signal indicating data to be written to a memory, wherein the pull-up/down driver is configured to activate the first pull-up driver when the command control signal indicates the memory access command is a write command and the signal indicating the data to be written indicates data associated with a high charge value is to be written to the memory.

4. The apparatus of claim 1, wherein the shared data line is shared between a first memory portion and a second memory portion.

5. The apparatus of claim 1, wherein the shared data line is shared between a first portion of a memory array and a second portion of the memory array.

6. The apparatus of claim 1 further comprising:
   a second transfer gate controller;
   a second transfer gate coupled to the second transfer gate controller, wherein the second transfer gate is configured to provide a conductive path between a second main data line and the shared data line when activated by the second transfer gate controller;
   a second pull-up driver coupled to the second transfer gate controller, wherein the second transfer gate controller is configured to enable the second pull-up driver; and
   wherein the pull-up/down driver is further coupled to the second pull-up driver, wherein the pull-up/down driver is configured to activate the second pull-up driver and wherein the second pull-up driver is configured to charge the second main data line when activated by the pull-up/down driver and enabled by the second transfer gate controller.

7. The apparatus of claim 1, wherein the first pull-up driver includes a second pull-up transistor coupled to the first main data line and a voltage source.

8. The apparatus of claim 7, wherein the second pull-up transistor includes a p-channel transistor.

9. An apparatus, comprising:
an array of memory cells having a first portion and a second portion;
a first main data line coupled to the first portion;
a second main data line coupled to the second portion;
a first transfer gate coupled to the first main data line;
a second transfer gate coupled to the second main data line;
a shared data line coupled to the first main data line when the first transfer gate is activated and further coupled to the second main data line when the second transfer gate is activated;
a pull-up/down driver comprising a pull-up transistor coupled to the shared data line, a pull-down transistor coupled to the shared data line, and control logic;
a first pull-up driver coupled to the control logic of the pull-up/down driver and the first main data line, wherein the first pull-up driver is configured to charge the first main data line to a high voltage level when the first pull-up driver is activated by the control logic of the pull-up/down driver; and
a second pull-up driver coupled to the control logic of the pull-up/down driver and the second main data line, wherein the second pull-up driver is configured to charge the second main data line to the high voltage level when the second pull-up driver is activated by control logic of the pull-up/down driver.

10. The apparatus of claim 9, further comprising:
a first transfer gate controller coupled to the first transfer gate and the first pull-up driver, wherein the first transfer gate controller is configured to activate the first transfer gate and enable the first pull-up driver; and
a second transfer gate controller coupled to the second transfer gate and the second pull-up driver, wherein the second transfer gate controller is configured to activate the second transfer gate and enable the second pull-up driver.

11. The apparatus of claim 10, further comprising:
a first conductive path coupled to the first transfer gate controller, wherein the first conductive path provides a first control signal to the first transfer gate controller, wherein the first transfer gate controller activates the first transfer gate and enables the first pull-up driver when the first control signal has a low logic state; and
a second conductive path coupled to the second transfer gate controller, wherein the second conductive path provides a second control signal to the second transfer gate controller, wherein the second transfer gate controller activates the second transfer gate and enables the second pull-up driver when the second control signal has a low logic state.

12. The apparatus of claim 10, wherein the first pull-up driver is only activated if the first pull-up driver is enabled by the first transfer gate controller and activated by the pull-up/down driver, and wherein the second pull-up driver is only activated if the second pull-up driver is enabled by the second transfer gate controller and activated by the pull-up/down driver.

13. The apparatus of claim 9, wherein only the first transfer gate or the second transfer gate is activated at a given time.

14. The apparatus of claim 9, wherein the high voltage level is a voltage level for writing data associated with a high charge value to a memory cell of the array of memory cells.

15. The apparatus of claim 9, further comprising:
a third conductive path coupled to the pull-up/down driver, wherein the third conductive path provides a command control signal indicative of a memory access command to the pull-up/down driver; and
a fourth conductive path coupled to the pull-up/down driver, wherein the fourth conductive path provides a signal indicative of data to be written to the array of memory cells to the pull-up/down driver,
wherein the pull-up/down driver is configured to provide an activation signal to the first pull-up driver and the second pull-up driver when the command control signal indicates a write command and the signal indicative of data to be written to the array of memory cells indicates data associated with a high charge value is to be written to the array of memory cells.

16. The apparatus of claim 15, further comprising a command decoder, wherein the command decoder is configured to provide the command control signal to the pull-up/down driver.

17. A method comprising:
providing a control signal to a transfer gate controller;
activating, with the transfer gate controller, a transfer gate to couple a shared data line to a main data line, wherein the activating is responsive to the control signal;
enabling, with the transfer gate controller, a pull-up driver, wherein the enabling is responsive to the control signal;
providing a command control signal to a pull-up/down driver;
providing a signal indicative of data to be written to a memory array to the pull-up/down driver;
activating, with the pull-up/down driver, the pull-up driver, when the command control signal has a state indicative of a write command and the signal has a state indicative of a high charge value to be written to a memory; and
charging, with the pull-up driver, the main data line.

18. The method of claim 17, further comprising charging the shared data line with the pull-up/down driver.

19. The method of claim 17, wherein the state indicative of the write command is a high logic state.

20. The method of claim 17, wherein the control signal is an active low signal.

* * * * *